(12) United States Patent
Tsuji et al.

(10) Patent No.: US 6,312,833 B1
(45) Date of Patent: Nov. 6, 2001

(54) MULTILAYERED WIRING LAYER

(75) Inventors: Satoshi Tsuji, Kanagawa-ken; Hiroshi Takatsuji, Shiga-ken; Katsuhiro Tsujimoto, Kyoto, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/022,914

(22) Filed: Feb. 12, 1998

(30) Foreign Application Priority Data

Mar. 24, 1997 (JP) .................................................... 9-090110

(51) Int. Cl.$^7$ ....................................................... B32B 15/10
(52) U.S. Cl. ............................ 428/654; 428/636; 428/650
(58) Field of Search ................................. 428/636, 654, 428/650

(56) References Cited

U.S. PATENT DOCUMENTS

| | | | |
|---|---|---|---|
| 2,995,808 | * 8/1961 | Weisse et al. ........................ | 428/636 |
| 4,899,206 | * 2/1990 | Sakurai et al. . | |
| 5,032,468 | * 7/1991 | Dumont et al. ........................ | 428/654 |
| 5,175,608 | * 12/1992 | Nihei et al. ........................... | 428/636 |
| 5,268,236 | * 12/1993 | Dumont et al. ........................ | 428/654 |
| 5,541,007 | * 7/1996 | Ueda et al. ............................ | 428/650 |

* cited by examiner

*Primary Examiner*—Cathy Lam
(74) *Attorney, Agent, or Firm*—Scully, Scott, Murphy & Presser; Derek S. Jennings

(57) ABSTRACT

A multilayered wiring layer having high thermal stability, high stress migration resistance and low electrical resistance. The wiring layer includes at least two layers formed on a substrate wherein each layer has substantially the same component and wherein the relationship between grain size and thickness of each of the at least two layers is $0.5 < d/h < 2$, wherein d is the grain size of each layer and h is the thickness of each layer.

9 Claims, 3 Drawing Sheets

MULTILAYERED WIRING LAYER

BACKGROUND OF THE INVENTION

1. Technical Field

The present invention relates to an electrode structure with low resistance and high thermal stability which has completely suppressed the generation of a hillock and a whisker as stress migration, as an electrode wiring material for liquid crystal displays, and also relates to a method of forming the electrode structure.

2. Prior Art

Pure metal, such as Cu, Al, Mo, Ta, and W, and alloy material, such as Al—Cu, Al—Cu—Si, Al—Pd, have hitherto been employed as low-resistance electrode wiring materials that are employed in semiconductor devices. On the other hand, particularly an electrode material for a liquid crystal display, which has been given attention as a flat panel display, has recently been required to have better characteristics than before, such as large area wiring for large screens, high integrated wiring for high fineness, and array formation which is film formation onto a glass substrate. In FIG. 1 there is shown a schematic diagram of one pixel section of the array of a liquid crystal display which has a thin-film transistor (TFT) as an active device. A display electrode 2, a gate line 3, a gate electrode 3A, a data line 4, a drain electrode 4A, a source electrode 5, and an active TFT device 6 are disposed on a single pixel opening portion 1. If the TFT is turned on by a signal on the gate line 3, then the electric potential on the data line 4 will become equal to the pixel electrode 2 connected to the data line 4 through the source electrode 5. As a consequence, the liquid crystal, enclosed in the upper portion of the pixel electrode 2 in the paper surface direction, is oriented and the pixel is caused to be in a display state. Here, the electrode wiring materials for the array of a liquid crystal display to which the present invention is applied indicate the gate line 3, the gate electrode 3A, the data line 4, the drain electrode 4A, and the source electrode 5.

The first required characteristic of the electrode wiring material for liquid crystal displays is that the electric resistance is small. If the electric resistance is large, various problems such as signal delay and heat generation will arise when the screen of a liquid crystal display is enlarged. Pure aluminum with low electric resistance has often been employed as a wiring material for liquid crystal displays. Pure aluminum is excellent in etching characteristic and also is a suitable material from the standpoint of adhesion with respect to a substrate. However, pure aluminum has the disadvantage that the melting point is low and it will easily give rise to defects, called hillocks and whiskers, by a thermal process in chemical vapor disposition (CVD) after formation of a wiring film. This thermal process is usually carried out at a temperature of 300 to 400° C. After this process, if the wiring material is observed by an electron microscope, there are cases where microscopic protrusions or bar-shaped crystal growth will be observed on the surface.

An example of defects such as this is shown in FIG. 2. Shown in FIG. 2 is a wiring layer 20 formed on a glass substrate 17. In general, a wiring layer consists of pure aluminum (Al) or the alloy and is constituted by some crystal grains 21 through 26. Here, a portion 30 extending lengthwise in the form of a whisker from the crystal grain 22 is called a whisker, and a portion 40 bulged from the crystal grain 24 is called a hillock. If the whisker 30 and the hillock 40 (hereinafter referred to as a hillock and the like) are generated, the smoothness of a wiring material layer will be lost, and a nitride film and an oxide film, which will be formed on the wiring material layer in a postprocess, will be formed on and along the underlying unevenness. Therefore, the generation of a hillock and the like will become an extremely large problem in the process of fabricating liquid crystal displays. The mechanism of the generation of a hillock and the like has not yet been settled, but it has been considered that if compression stress acts on a thin film by a difference in linear expansion coefficient between the thin film and the substrate due to heating, Al atoms will be moved toward the surface of a wiring layer along a grain boundary with this compression stress as a driving force, whereby a hillock and the like will be generated.

If high-melting point metal, such as Cr, Ti, Ta, and MoTa, is used in wiring material, the generation of a hillock can be prevented because the generation of atom diffusion along a grain boundary is difficult. However, these high-melting point metals are wiring materials which do not meet a tendency in increased size of the liquid crystal display, because the specific resistances generally are high like more than 50 $\mu\Omega$ cm (about 3 $\mu\Omega$ cm for aluminum).

SUMMARY OF THE INVENTION

A primary object of the present invention is to provide a wiring layer which has high thermal stability, is excellent in stress migration resisting characteristic, has no defect such as a hillock and the like, and is considerably low in electric resistance, as an electrode wiring material, particularly an electrode wiring material that is used in liquid crystal displays.

A secondary object of the present invention is to provide a method of forming a multilayer film consisting of thin films of Al alloy without taking a stacked structure between a thin film of Al alloy and a thin film of another metal, while having the aforementioned characteristics, such as high thermal stability, a reduced generation of a defect such as a hillock and the like, and low electric resistance.

The problems of the present invention can be solved by providing a multilayered wiring layer which consists of substantially a single component and comprises at least two layers. Particularly, the present invention is a multilayered wiring layer comprising at least two layers formed on a substrate. Each layer of the multilayered wiring layer has substantially the same component, and the grain size of each layer is nearly the same as the thickness of each layer. Also, it is preferable that a ratio of the crystal grain size (d) and the thickness (h) of each layer be 1, however, if the relation is in a range of 0.5<d/h<2, the objects of the present invention will be realizable.

In the present invention it is preferable that the wiring layer have aluminum substantially as its main component. It is desirable that an additional element which is added to aluminum be rare earth elements. Furthermore, among rare earth elements, Y is suitable. By making an addition quantity of an additional element to less than 3.0 atom %, there can be realized 3.0 to 5.0 $\mu\Omega$ cm which is sufficiently low electric resistance required of a wiring layer.

Also, the present invention includes a method of forming metal wiring layers which prevent generation of a hillock and the like. The metal wiring layer forming method according to the present invention is a method of forming metal wiring layers which prevent generation of unevenness on surfaces of the metal wiring layers formed on a substrate. A first layer of the wiring layers is formed onto the substrate, and a layer having substantially the same component as the first layer is formed onto the entire surface of the first layer by continuous electric discharge.

BRIEF DESCRIPTION OF THE DRAWINGS

Preferred embodiments of the present invention will now be described, by way of example only, with reference to the accompanying drawings, in which.

DETAILED DESCRIPTION OF THE PREFERRED EMBODIMENTS OF THE INVENTION

In the present invention, with aluminum as a base, Y is added to the base as an additional element to form a stacked structure that consists of a plurality of metal layers each having nearly the same composition. The stacked structure satisfies the aforementioned characteristics. Generally, if an additional element is added to aluminum (Al), the electric resistance will tend to increase. Particularly when an additional element is melted into an aluminum (Al) base, this tendency becomes strong. Therefore, investigations have been made in quest of elements which can improve a heat resistance characteristic and prevent the generation of a defect such as a hillock and the like, by a very small quantity of addition. Also, a stacked structure is formed by the same material, the same processing room, and continuous electric discharge, and an attempt has been made to form a low-electric resistance wiring structure which is excellent in stress migration resisting characteristic. The principles of the present invention are derived from the cause of the generation of a hillock and the like. That is, for the mechanism of the generation of a hillock and the like, as described above, it has been considered that a hillock and the like are generated by the fact that compression stress acts by a difference in linear expansion coefficient between a thin film and a substrate due to heating and with this compression stress as a driving force, aluminum (Al) atoms move along a grain boundary. The feature of the conventional method of solution by an alloy of the high-melting point metal element addition type resides rather in that the growth of crystal grains by diffusion of aluminum (Al) atoms along a grain boundary is suppressed by precipitation of a metal-to-metal compound between an additional element and aluminum (Al). This method of solution is one which does not give attention to a reduction in the compression stress that is the root cause of a hillock and the like, but devotedly suppresses diffusion of aluminum atoms while tolerating this compression stress.

However, since it is supposed that a hillock and the like have a mechanism of generation such as described above, the hillock and the like should be suppressed by a more drastic countermeasure. The present invention has developed such a method of solution and given attention to the crystal structure of the wiring layer rather than the composition of the wiring layer.

That is, the present invention makes the structure of the wiring layer into a multilayer film and adopts a crystal structure where the grain size of crystal grains forming each layer is made nearly the same as the thickness of each layer.

Figure 1:
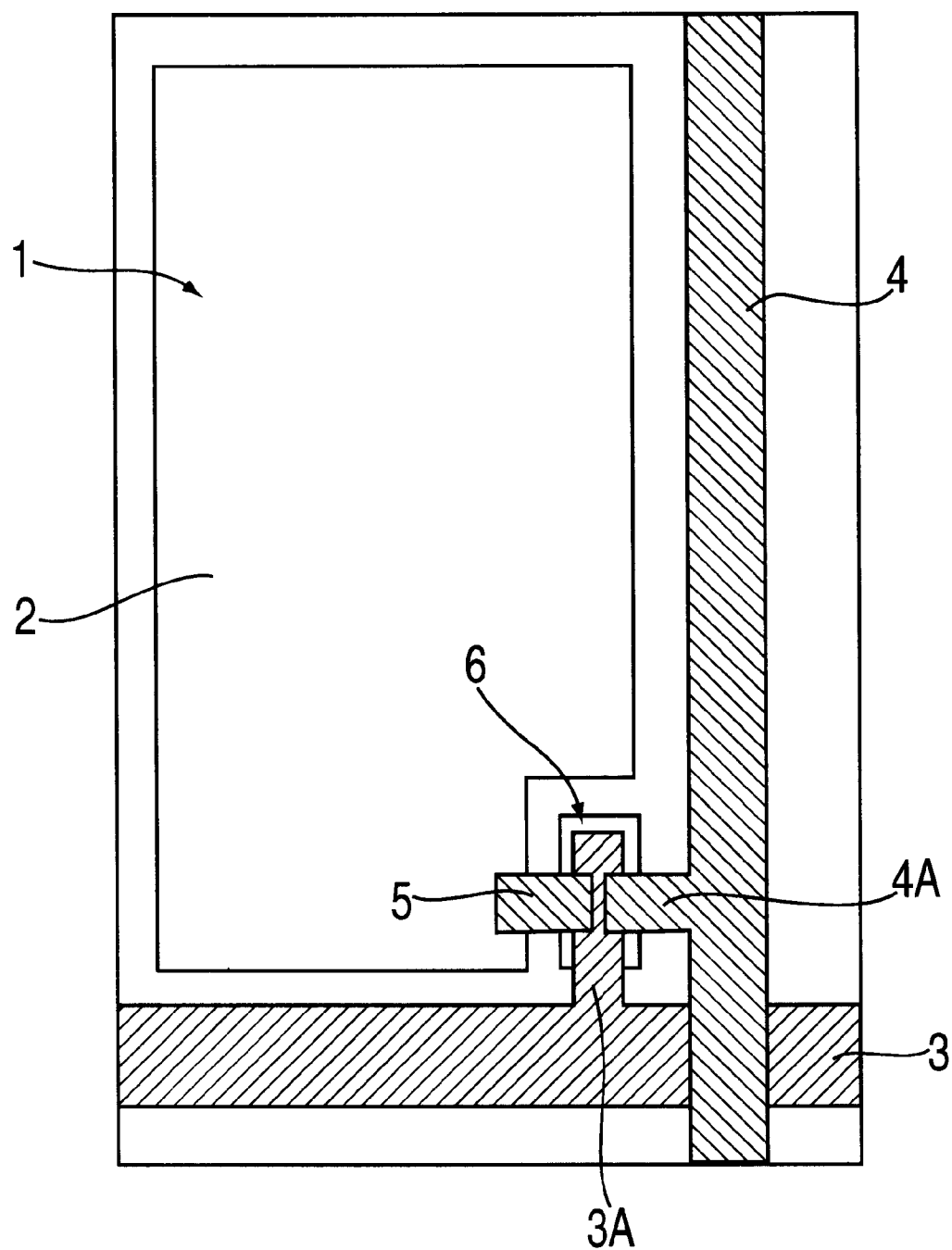
FIG. 1 is a plan view of a pixel section on the array side of a thin-film transistor liquid crystal display.
Figure 2:
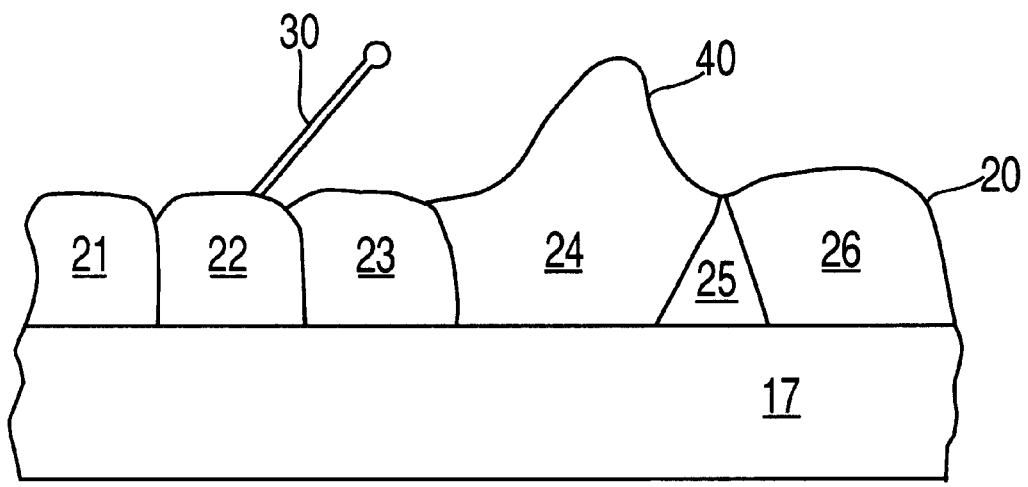
FIG. 2 is a diagram showing an example of a typical surface defect which is generated in an aluminum (Al) wiring layer.
Figure 3:
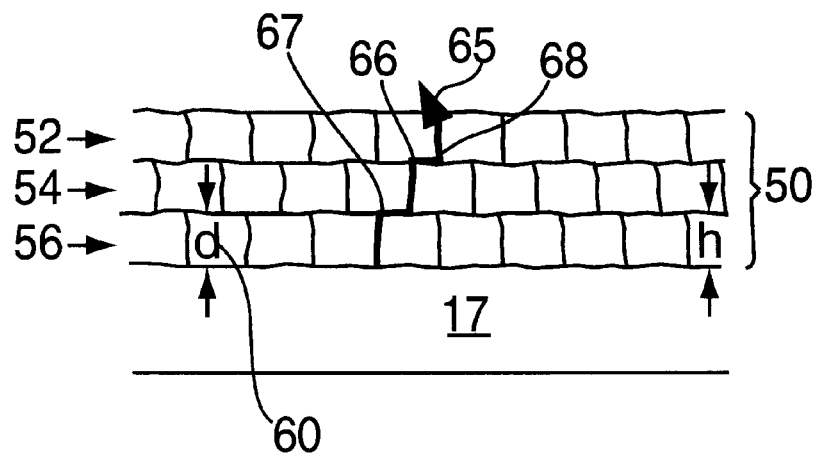
FIG. 3 is a schematic view of the cross section of a novel wiring layer according to the present invention.

The structure of the present invention is schematically shown in FIG. 3. That is, in the crystal structure according to the present invention, on a substrate 17 a wiring layer 50 is formed by a plurality of layers 52, 54, and 56. Each of the layers 52, 54, and 56 consists of substantially the same composition. Also, it is preferable that the size (d) of each crystal grain 60 be nearly the same as the height (h) of each of the layers 52, 54, and 56, or it is desirable that the grain size and the layer height have a relation of $0.5<d/t<2$. By such a structure, the structure of the present invention becomes a structure which looks as if one brick block were laid on another.

From this crystal structure a mechanism which can prevent a hillock and the like is assumed as follows. First, according to the structure of the present invention, since crystal grains are approximately uniform in size, the structure easily alleviates the compression stress which acts by a difference in linear expansion coefficient between a wiring layer and a substrate. That is, in the case where crystal grains are non-uniformed in size, the generation of a hillock and the like is accelerated by a mechanism which produces stress concentration at a grain boundary between small crystal grains, however, if crystal grains are uniform in size, there will be a small possibility of stress concentration.

Second, each crystal grain is 100 nm in size at most, so it is relatively small. In such a small crystal grain, since there is a relatively low chance that an additional element exists locally within a grain and also an additional element precipitates along a grain boundary, it is considered that the precipitation of an additional element can suppress diffusion of an aluminum atom to a surface at a crystal grain boundary which causes a hillock and the like. That is, in this multilayer film structure, particularly such a thin film as to disturb movement of an aluminum atom does not exist in the interface between layers, however, in the interface where grains are uniform in size, the growth of crystal grains due to diffusion of aluminum atoms along a grain boundary can be effectively suppressed by precipitation of a metal-to-metal compound between an additional element and aluminum (Al).

Third, since the structure of the present invention consists of a plurality of layers, thermal stress produced due to a difference in linear expansion coefficient between a substrate and a wiring layer is gradually alleviated for each layer. Therefore, it is considered that the compression stress which causes a hillock and the like has become low in a layer near a surface.

Last, according to the structure of the present invention, the path of a grain boundary which is the diffusion path of an aluminum atom is complicated. Therefore, atoms need to pass through a curved complicated grain boundary to diffuse from an aluminum layer near the surface of a substrate, so that diffusion is easily blockable on the way with force. For example, in reference to FIG. 3, an aluminum atom needs to pass through a path 65 to reach a surface by diffusion, however, there are the inflection points 66, 67, and 68 of grain boundaries on the way and therefore diffusion of an aluminum atom is easily blocked. Furthermore, in a grain boundary running in a direction parallel to a substrate, no driving force due to compression stress acts, and consequently, diffusion itself is in a direction in which it is suppressed.

The aforementioned is a description along a common opinion in academic societies and has not completely been demonstrated. However, it is supposed that some of the aforementioned principles contribute greatly to the remarkable effect of the present invention which prevents a hillock and the like and also principles other than that have some contribution. Which of these is a dominant mechanism will depend upon future research.

An embodiment of the present invention will be described along with a specific thin-film formation process.

A thin film of Al—Y alloy was continuously formed at the same processing room, and thereafter, thermal processing was performed at 300° C. within the same processing room. As this result, as shown in FIG. 4 (attached sectional photograph), there was obtained a six-layer structure where each layer has a polycrystalline structure with a thickness of 50 nm.

Figure 4:
FIG. 4 is a sectional photograph (taken by a transmission type electron microscope) showing a six-layer crystal structure of an embodiment of the present invention.

The fabrication conditions for the wiring layer of FIG. 4 are as follows. Films are formed by employing an Al—Y alloy target (Y content percentage, 3.0 atom %). The film formation making power is 44 kW and the film formation pressure is 0.7 Pa. The film formation device uses a dc magnetron type sputtering device. The rock of the bar magnet of this sputtering device was reciprocated 6 times to form a film of 300 nm in thickness. With this operation, after the first layer of the wiring layers has been formed on a substrate, a layer having substantially the same composition can be formed over the entire surface of the first layer by continuous electric discharge. In the embodiment of the present invention, while the rock of the bar magnet has been reciprocated 3 times to form a wiring layer of 300 nm in thickness, this is the design condition of the process. For example, if the bar magnet is reciprocated twice, there can be obtained a wiring layer where four layers each having a thickness of 75 nm are stacked. It is held that it is preferable that the thickness of each layer be about 100 nm at most.

In Table 1 there are shown the occurrence rates of a hillock and a whisker and the grain size after the thermal processing of the fabricated thin film of Al—Y alloy at a temperature of 300° C. under a vacuum of $2 \times 10^{-5}$ Torr for one hour. For the measurement of the numbers of a hillock and a whisker generated, impressions are applied beforehand on a thin film at 10 places by a Vickers hardness tester to increase quantitativeness, and the hillock and whisker generated around the impressions were counted. For comparison, the results of pure aluminum (Al) and Al—Cu (0.2 weight %) according to a conventional method are also shown in Table 1.

TABLE 1

| | Sample | Hillock occurrence rate | Whisker occurrence rate | Grain size (nm) |
|---|---|---|---|---|
| Embodiment | Al-Y | 0 | 0 | 50 to 60 |
| Comparative example | pure Al | 39 | 3 | 330 to 500 |
| Comparative example | Al-Cu | 15 | 0 | 150 to 300 |

In Table 1, note that the comparative examples employ single-layer structures.

As evident in Table 1, it is found that the thin film of Al—Y alloy of the present invention has high thermal stability and also has high reliability having no hillock and whisker defects and is an optimum alloy and layer structure as an electron wiring material for liquid crystal displays. The grain size is sufficiently fine compared with the two conventional methods, and the electric resistance after heating was about 4.0 $\mu\Omega$ cm.

As described above, it becomes possible to effectively prevent defects, such as a hillock and the like, in accordance with the present invention. It is assumed that the principles have no direct relation with the composition of the wiring layer. Therefore, if a wiring layer has aluminum (Al) as its main component, a similar advantage could be obtained even if an element other than Y were employed as an additional element. Particularly, rare earth metal elements have properties similar to each other. Therefore, rare earth metal elements other than Y, for example, Nd, Sm, Th, Gd, Tb, and Dy, can also have a similar advantage. In addition, while the embodiment of the present invention has been premised on an assumption that each layer has a single composition, the expected objects of the present invention will be achievable if some of a plurality of layers have substantially the same composition. As previously described, this is because the present invention prevents a hillock and the like not by the composition of a wiring layer but by the crystal structure. If all layers have a single composition, a multilayered wiring layer can be formed in the same processing room by continuous electric discharge and therefore have a great advantage when processed.

Therefore, the points required as material for the wiring layer according to the present invention are as follows. First, it is necessary that electric resistance is sufficiently low. However, as previously described, this requirement is merely the precondition of the present invention. In general, it is preferable that the electric resistance of the wiring layer be less than 5 $\mu\Omega$ cm for the use of wiring of liquid crystal displays. However, even if a material for a wiring layer had electric resistance higher than this, it could be utilized depending upon uses. The second requirement is that a polycrystalline structure is easily formed. The present invention prevents the generation of a hillock and the like by stacking each of the wiring layers by a polycrystalline structure. Therefore, this requirement becomes essential for the present invention. Third, it is necessary that dry etching is easy to form wiring patterns. For this reason, for an Al—Y alloy, for example, it is preferable that a concentration of Y be less than 3.0 atom %.

In the present specification, while the wiring material and wiring structure for liquid crystal displays have been described for reasons of explanation, the wiring material and wiring structure according to the present invention can also be employed in other uses which have the similar required characteristic that (1) electric resistance is low and (2) a defect such as a hillock and the like should not be generated due to high temperature. Therefore, the present invention is also applicable, for example, to the wiring material and wiring structure for semiconductor devices.

There can be formed a wiring layer where there is no generation of a hillock and the like against a thermal stress of about 300° C. and which has high reliability and a low resistance of 3.0 to 5.0 $\Omega$ cm near to a pure aluminum (Al) material. For this reason, the present invention is applicable to an electrode wiring material with low resistance and high reliability which have been required of future large and high-fine liquid crystal displays. In addition, since the aforementioned advantages can be derived by a film whose impurity concentration is low like this, the present invention can readily cope with the size of a sputtering target which is increased as the size of a substrate is increased, and the processing cost can be considerably reduced.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A multilayered wiring layer comprising at least two layers formed on a substrate wherein said at least two layers have substantially the same component and wherein the relationship between grain size and thickness of each of said at least two layers is 0.5<d/h<2, wherein d is the grain size of each layer and h is the thickness of each layer.

2. The multilayered wiring layer as set forth in claim 1, which has aluminum substantially as its main component.

3. The multilayer wiring layer as set forth in claim 1 wherein said layers include yttrium in a concentration of less than 3.0 atom %.

4. The multilayered wiring layer as set forth in claim 1, wherein electric resistance is less than 5.0 $\mu\Omega$ cm.

5. The multilayered wiring layer as set forth in claim 1, wherein the thickness of each layer is less than 100 nm.

6. A multilayered wiring layer comprising at least two layers formed on a substrate wherein said at least two layers have substantially the same component; a grain boundary between said layers substantially parallel to a surface of said substrate; aluminum substantially as its main component; and said at least two layers include yttrium in a concentration of less than 3.0 atom %.

7. The multilayered wiring layer as set forth in claim 6, wherein electric resistance is less than 5.0 $\mu\Omega$ cm.

8. The multilayered wiring layer as set forth in claim 6, wherein the thickness of each layer is less than 100 nm.

9. A multilayered wiring layer comprising at least two layers formed on a substrate wherein said at least two layers have substantially the same component; a grain size of each of said at least two layers is substantially the same as a thickness of each layer; aluminum is substantially its main component; and said layers include yttrium in a concentration less than 3.0 atom %.

* * * * *